(12) United States Patent
Ma

(10) Patent No.: US 7,217,149 B2
(45) Date of Patent: May 15, 2007

(54) LAND GRID ARRAY CONNECTOR WITHOUT UNDESIRED ENGAGEMENT

(75) Inventor: Hao-Yun Ma, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/284,711

(22) Filed: Nov. 21, 2005

(65) Prior Publication Data
US 2006/0110967 A1    May 25, 2006

(30) Foreign Application Priority Data
Nov. 19, 2004    (TW) ............................... 93218545 U

(51) Int. Cl.
*H01R 13/62*    (2006.01)
(52) U.S. Cl. ...................................... 439/331
(58) Field of Classification Search ................ 439/331, 439/66, 71, 73, 108
See application file for complete search history.

(56) References Cited

U.S. PATENT DOCUMENTS 3,831,131 A * 8/1974 Woodcock et al. ......... 439/331
3,960,423 A * 6/1976 Weisenburger ............... 439/66
4,706,161 A * 11/1987 Buckingham ............... 361/220
5,167,515 A * 12/1992 Matsuoka et al. .......... 439/108
5,344,334 A * 9/1994 Laub et al. ................. 439/331
5,669,784 A * 9/1997 Ito et al. ..................... 439/331

* cited by examiner

*Primary Examiner*—Tulsidas C. Patel
*Assistant Examiner*—Vladimir Imas
(74) *Attorney, Agent, or Firm*—Wei Te Chung

(57) ABSTRACT

An LGA connector (1) includes an insulative housing (2), a stiffener (3) defined around the housing, a clip (4) pivotably engaged on one end of the stiffener, and a lever (5) engaged on an opposite end of the stiffener for fastening the clip onto the housing. The stiffener includes a bottom plate (31) and a plurality of side walls (32) extending from the bottom plate, and the housing includes a plurality of side surfaces aligned with said side walls. A gap is formed between corresponding side surface of the housing and side wall of the stiffener. The clip includes a main plate (41) and a pair of side plates (42) extending from the main plate. A slot (34) is formed in corresponding position of the bottom plate of the stiffener for accepting the side plate of the clip partly when the clip is rotated to a horizontal closed position.

18 Claims, 6 Drawing Sheets

LAND GRID ARRAY CONNECTOR WITHOUT UNDESIRED ENGAGEMENT

BACKGROUND OF THE INVENTION

1. Field of the invention

The present invention relates to an electrical connector for electrically connecting an electronic package such as an integrated circuit (IC) chip with a circuit substrate such as a printed circuit board (PCB), and particularly to a land grid array connector adapted for receiving a land grid package (LGP) therein and electrically connecting the LGP with a PCB.

2. Description of the Prior Art

Land grid array (LGA) connector for electrically connecting a Land Grid Package (LGP) with a printed circuit board (PCB) is widely used in the field of electrical connectors. The LGA connector typically comprises an insulative housing, a stiffener defined around the housing, a clip pivotably engaged on one end of the stiffener, and a lever engaged on an opposite end of the stiffener for fastening the clip onto the housing. The LGP is clasped between the clip and the housing.

Referring to FIGS. 5–6, a conventional Land Grid Array (LGA) connector is illustrated. The LGA connector 6 comprises an insulative housing 61, a stiffener 62 defined around the housing 61, a metal clip 63 pivotably engaged on one end of the stiffener 62, and a lever 64 engaged on an opposite end of the stiffener 62 for fastening the clip 63 onto the housing 61. The stiffener 62 comprises a bottom plate 621 and four sidewalls 622 therefrom. Said clip 63 and lever 64 are pivotably engaged on two sidewalls 622 of the stiffener 62 respectively, and the housing 61 is mounted on the bottom plate 621 of the stiffener 62, with a gap between a side surface of the housing 61 and corresponding sidewall 622 of the stiffener 62. The clip 63 has a substantially rectangular configuration, with a window in the middle thereof. The clip 63 comprises a main plate 630 and a pair of side plates 632 extending downwardly from opposite sides of the main plate 630. The lever 64 comprises an operation lever 641 and a perpendicular pressing lever 642 for pressing the clip 63 to clasp the LGP 7 between the clip 63 and the housing 61.

In use, the clip 63 is first rotated to a vertical open position, and the LGP 7 is seated onto a predetermined position of the housing 61. Then the clip 63 is rotated to a horizontal close position. When the main plate 630 of the clip 63 is fittingly rested on LGP 7, the side plate 632 goes into the gap between the side surface of the housing 61 and corresponding side wall 622. When the operation lever 641 is subsequently actuated, the pressing portion 6422 presses an end of the clip 63, therefore fastening the housing 61 and LGP 7 between the stiffener 62 and the clip 63.

Because the clip 63 presses onto the LGP 7 for sandwiching the LGP onto the housing 61, the main plate 630 is required rigid enough for avoiding distortion under pulling force. In order to improve the anti-bending performance of the main plate 630, the side plate 632 is proposed to extend relatively farer from the main plate 630, therefore preventing the main plate 630 from bending downwardly. However, if the side plate 632 is elongated, it is liable to engage with the bottom plate 621 of the stiffener 62. The upshot is that the firm clasping the LGP 7 between the clip 63 and the stiffener 62 is diminished.

In view of the above, a new LGA connector which overcomes the above-mentioned disadvantages is desired.

SUMMARY OF THE INVENTION

Accordingly, an object of the present invention is to provide an LGA connector that can prevent undesired engagement between the clip and the stiffener, therefore ensuring reliability connecting performance of the LGA connector.

To achieve the above-mentioned object, an LGA connector in accordance with the present invention comprises an insulative housing, a stiffener defined around the housing, a clip pivotably engaged on one end of the stiffener, and a lever engaged on an opposite end of the stiffener for fastening the clip onto the housing. The stiffener comprises a bottom plate and a plurality of side walls extending from the bottom plate, and the housing comprises a plurality of side surfaces aligned with said side walls. A gap is formed between corresponding side surface of the housing and side wall of the stiffener. The clip comprises a main plate and a pair of side plates extending from the main plate. A slot is formed in corresponding position of the bottom plate of the stiffener for accepting the side plate of the clip partly when the clip is rotated to a horizontal closed position. Therefore, even if the side plate is designed long enough to improve the anti-bending performance of the main plate of the clip, the side plate will not engage with the bottom plate of the stiffener. Thus reliability of the land grid array connector is ensured.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
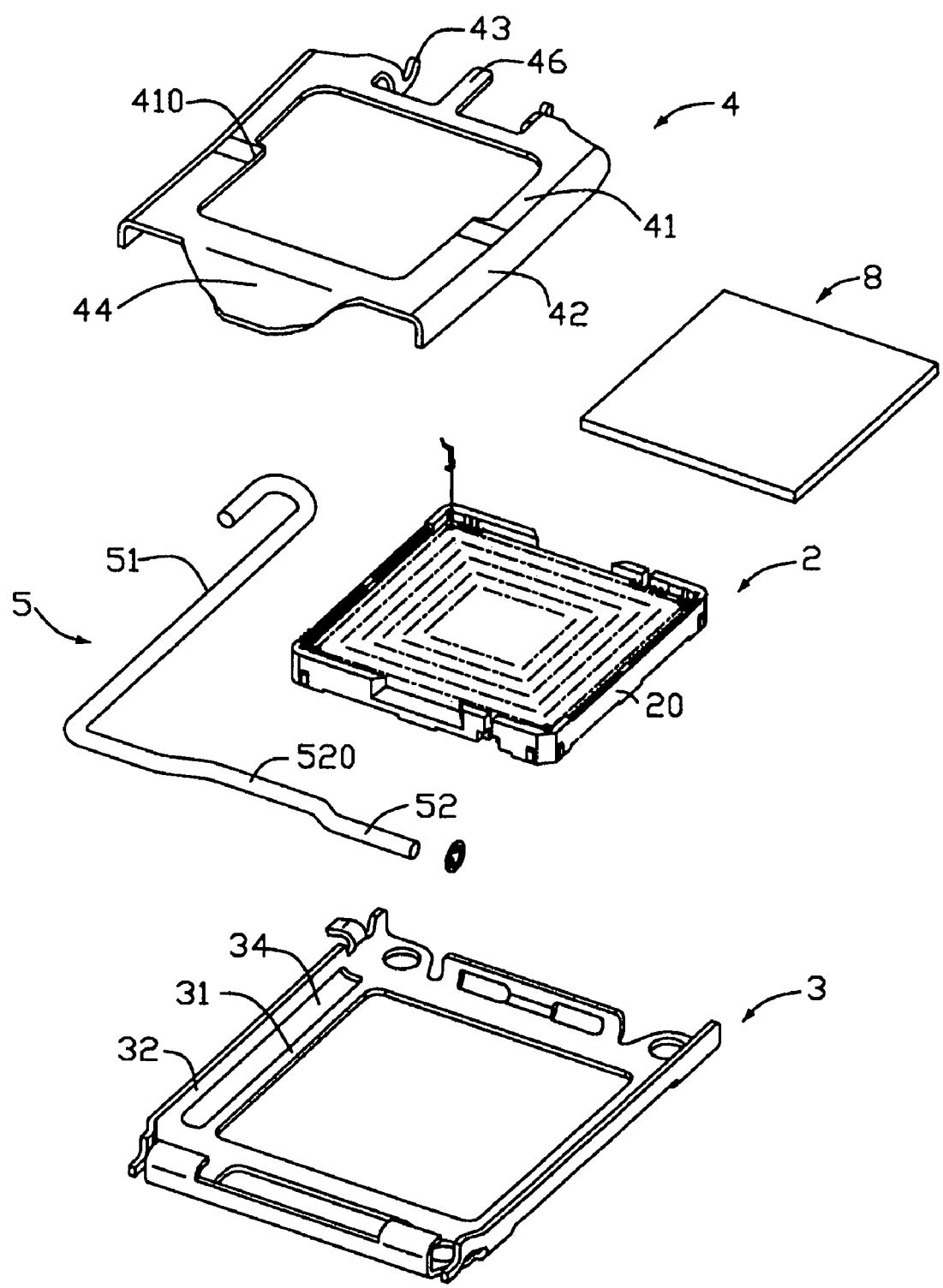
FIG. 1 is an exploded, isometric view of a land grid array connector in accordance with the embodiment of the present invention, together with a land grid package ready to be mounted onto the housing of the land grid array connector.
Figure 2:
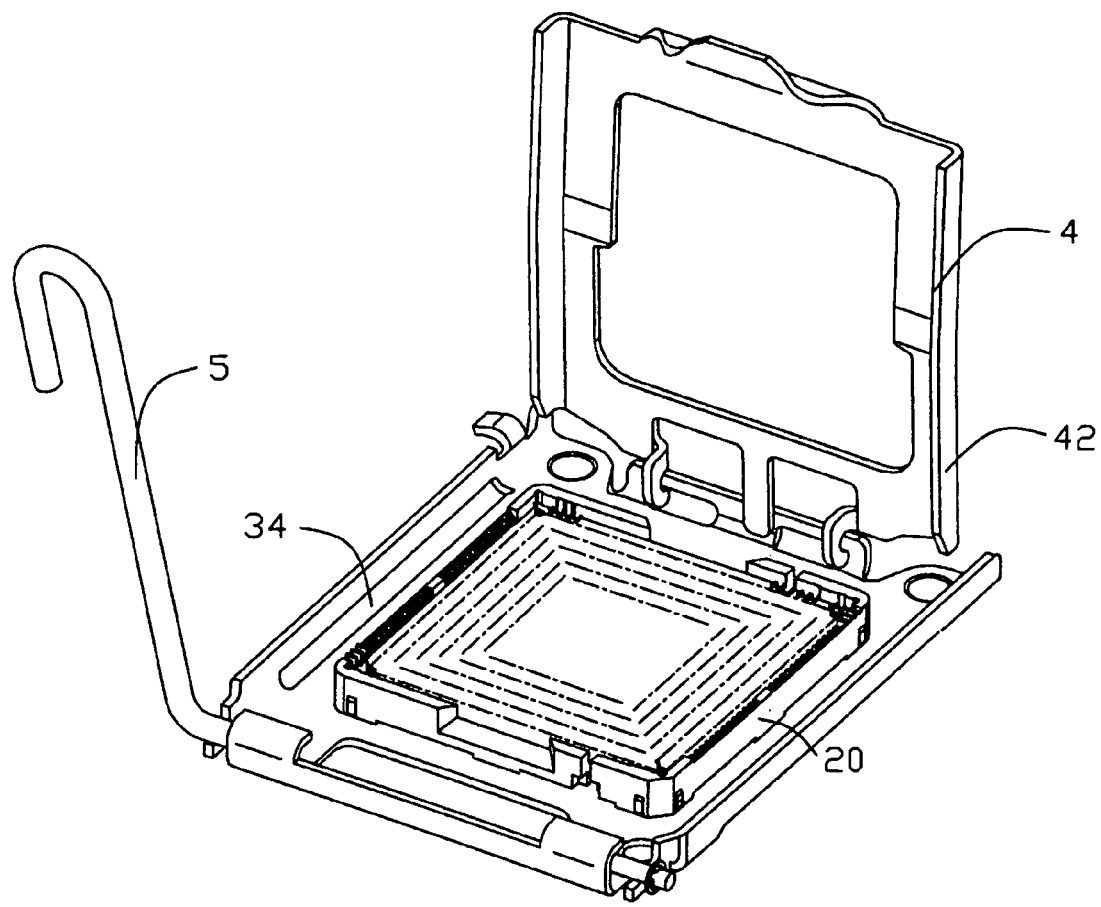
FIG. 2 is an isometric view of the land grid array connector in FIG. 1, with the clip in a vertical open position.
Figure 3:
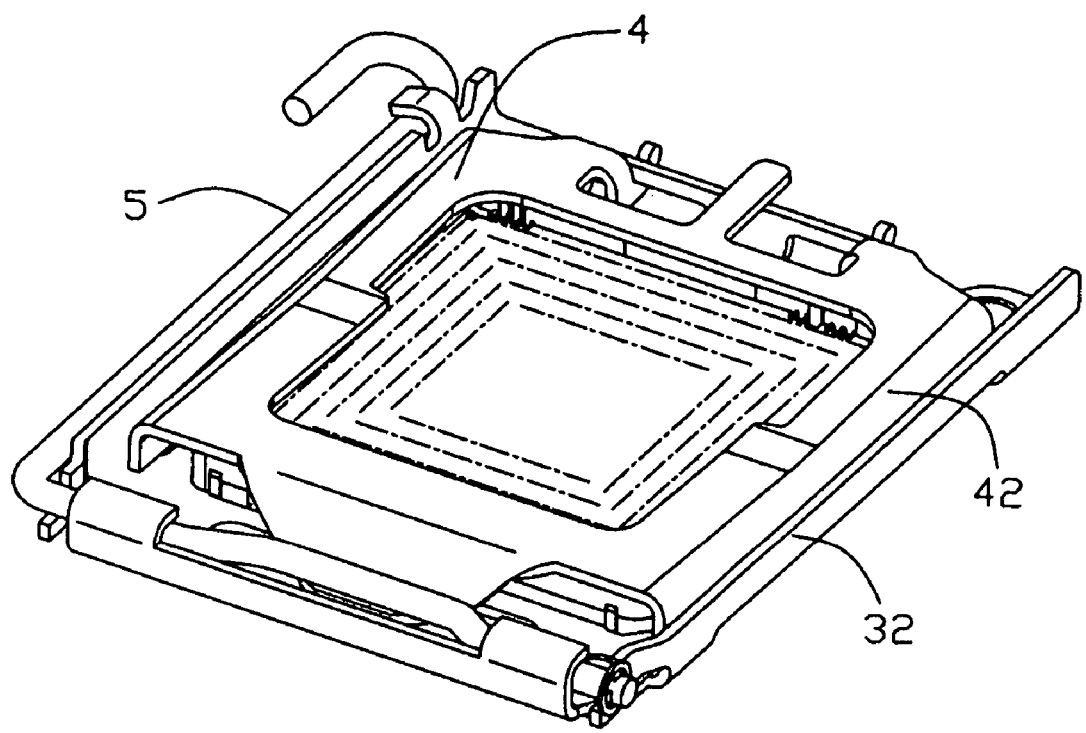
FIG. 3 is an isometric view of the land grid array connector of FIG. 1, with the clip in a horizontal closed position.
Figure 4:
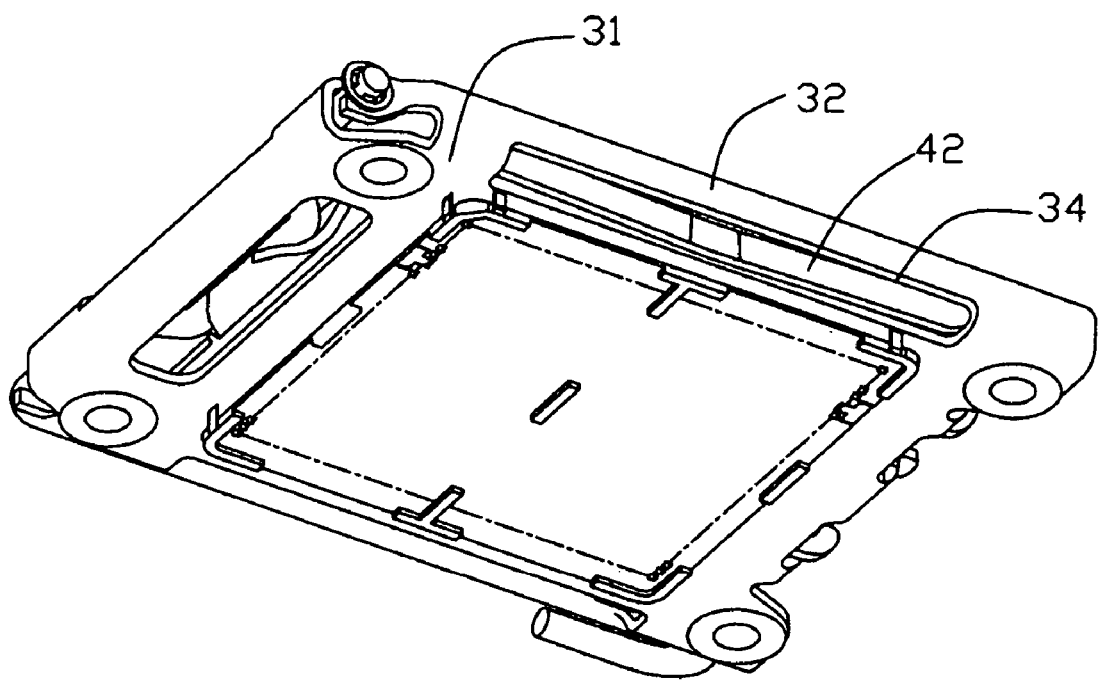
FIG. 4 is an isometric view of the land grid array connector of FIG. 1, showing a side plate of the clip inserting into a slot of stiffener partly.
Figure 5:
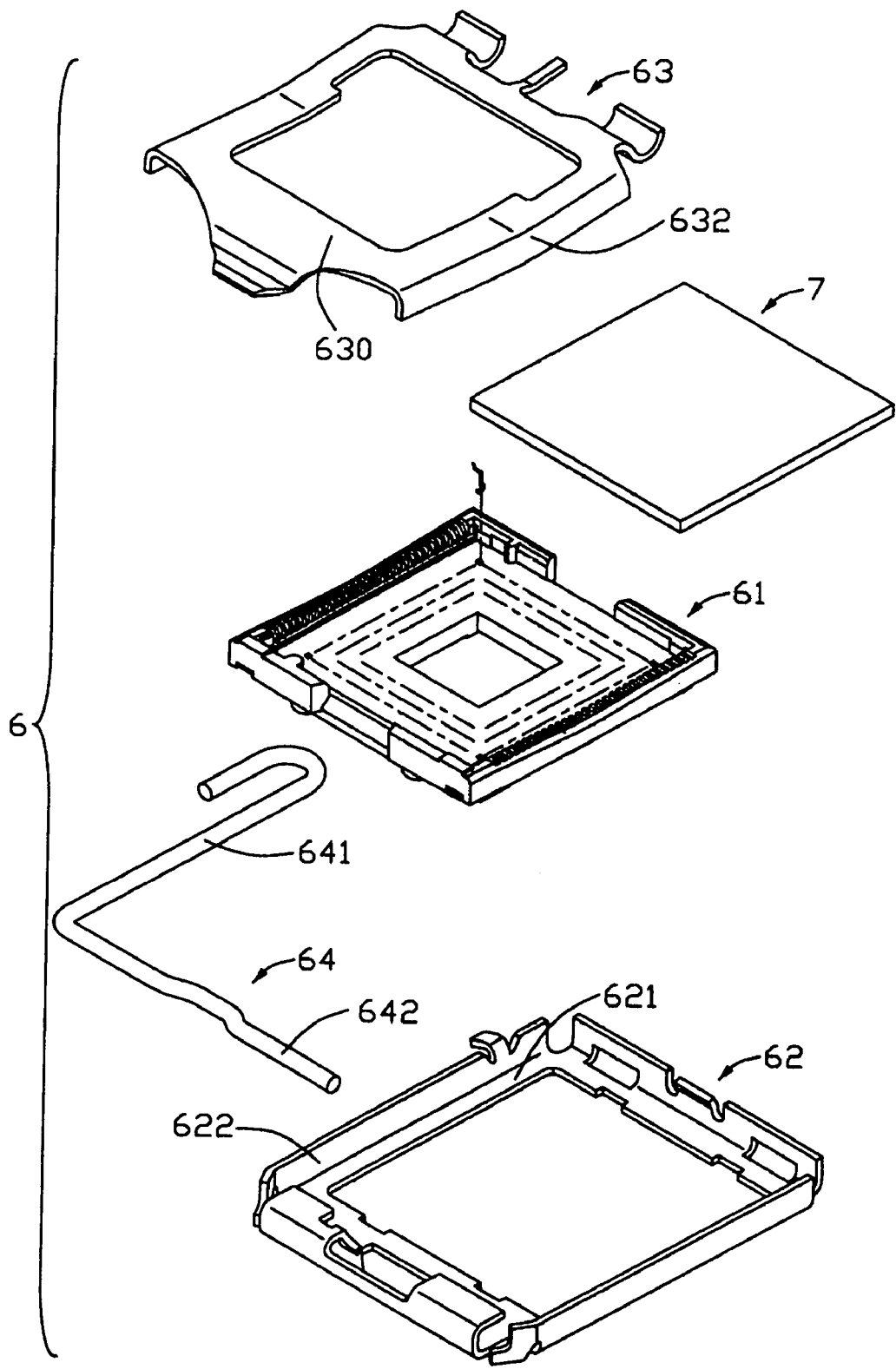
FIG. 5 is an exploded, isometric view of a conventional land grid array connector, together with a land grid package ready to be mounted onto the housing of the land grid array connector.
Figure 6:
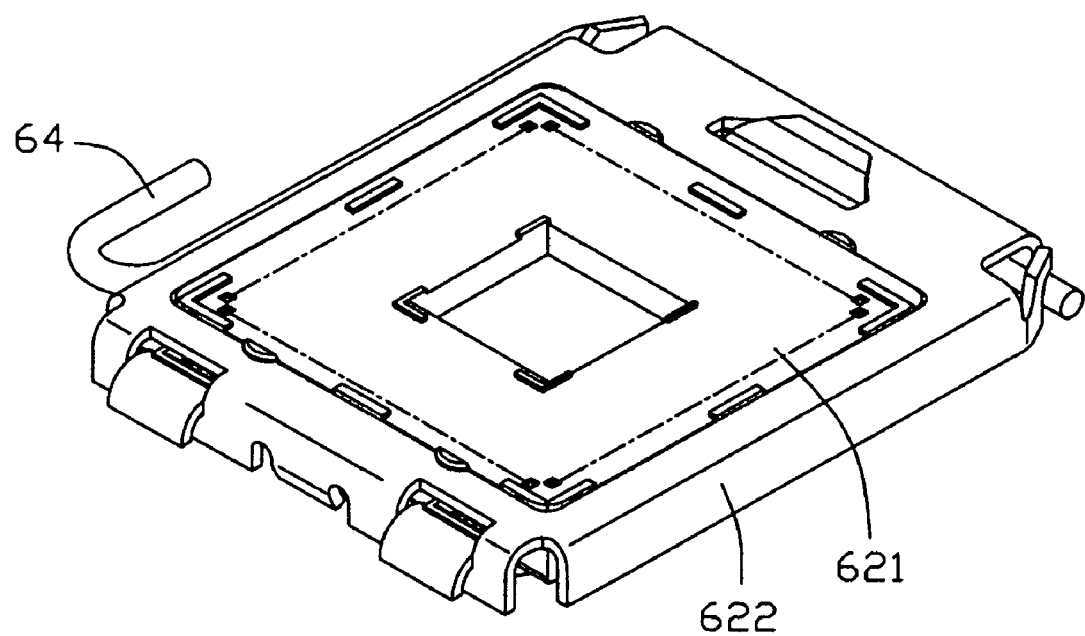
FIG. 6 is an inverted isometric view of the land grid array connector in FIG. 5.

Referring to FIGS. 1–4, a land grid array connector 1 in accordance with the embodiment of the present invention comprises an insulative housing 2, a stiffener 3 defined around the housing 2, a metal clip 4 pivotably engaged on one end of the stiffener 3, and a lever 5 engaged on an opposite end of the stiffener 3 for fastening the clip 4 onto the housing 2. A Land Grid Package 8 (LGP) is ready to be disposed between the housing 2 and the clip 4, for connecting with the printed circuit board via the connector 1.

The housing 2 has a substantially rectangular configuration with a plurality of side surfaces. A plurality of passageways (not labeled) is defined in the housing 2 for receiving a corresponding number of electrical contacts (not labeled) therein. The stiffener 3 comprises a bottom plate 31 and four side walls 32 extending upwardly from the bottom plate 31. The bottom plate 31 and side walls 32 cooperatively define a receiving room for accommodating the housing 2. Said clip 4 and lever 5 are pivotably engaged two opposite side walls 32 of the stiffener 3. The housing 2 is mounted on the stiffener 3, and another two opposite side walls 32 and corresponding side surfaces each define a gap therebetween. The bottom plate 31 of the stiffener 3 defines slots 34 aligned with said gaps and in communication with the side walls 32.

The clip 4 is also substantially rectangular. The clip 4 comprises a main plate 41 with a middle window and a pair of side plates 42 extending toward the housing 2 from two opposite sides of the main plate 41. The length is of the side plats 42 is smaller than the length of the slot 43, and the extending distance of the side plate 42 from the main plate 41 is also relatively long, therefore preventing the main plate 41 from bending. That is, the anti-bending performance of the main plate 41 is improved. The side plate 42 has also a substantially rectangular configuration with a long outer edge, and the outer edge of the side plate 42 enters into the slot 43 of the stiffener 4 when the clip 4 is pressed down by the lever 5. A pair of hooks 43 and an anti-rotation bar 46 therebetween extend from one side of the main plate 41 for engaging with corresponding side walls 32 of the stiffener 3, and a extending portion 44 extends from the opposite side of the main plate 41 for being pressed by the lever 5. A pair of clasping portions 410 bends toward the housing 2 in a middle of the main plate 41 for pressing the LGP 8.

The lever 5 comprises a operation lever 51 and a pressing lever 52 perpendicular to the operation lever 51. The pressing lever 52 defines a middle pressing portion 520 for pressing onto the extending portion 44 of the clip 4, therefore fastening the LPG between the stiffener 3 the clip 4.

In assembly, the housing 2 is mounted in the receiving room formed by the bottom plate 31 and side walls 32 of the stiffener 3, and then the clip 4 and the lever is engaged at two opposite side walls 32 of the stiffener 3, respectively. Another two opposite side walls 32 and corresponding side surfaces of the housing 2 each define a gap therebetween.

In use of the connector 1, the LGP 8 is disposed onto the housing 2. The clip 4 is then rotated downwardly to a horizontal closed position, and the side plates 42 enter corresponding gaps between side surfaces of the housing 2 and corresponding side walls 32. When the lever 5 is actuated to press the extending portion 44 of the clip 4, the clasping portions 410 of the clip 4 press down on the LGP 8, and the relatively long side plates 42 enter corresponding slots 34 of the stiffener 3.

Because the slots 34 are defined in the bottom plate 31 and are aligned with the side plates 42 of the clip 4, the side plates 42 will enter said slots 34 when the clip 4 is pressed down by the lever 5. Therefore the side plates 42 will not engage with the bottom plate 31 of the stiffener 3 even if the side plates 42 extend relatively far away from the main plate 41 for improving anti-bending performance of the main plate 41.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A land grid array connector for interconnecting a land grid package and a circuit substrate, the land grid array connector comprising:
    a housing comprising a plurality of side surfaces;
    a stiffener defined around the housing, the stiffener comprising a bottom plate and a plurality of side walls extending upwardly from the bottom plate;
    a clip pivotably engaged in one side wall of the stiffener, the clip comprising a main plate and a pair of side plates extending from two opposite sides of the main plate;
    a lever engaged in an opposite side wall of the stiffener for fastening the clip;
    wherein the side walls and corresponding side surfaces define gaps therebetween for accommodating the sideplates, at least one slot is defined in the bottom plate aligned with said gaps, the side plate enters said slot at least partly when the clip is fastened by the lever.

2. The land grid array connector as claimed in claim 1, wherein the slot is defined in communication with the bottom plate and the side walls extending therefrom.

3. The land grid array connector as claimed in claim 2, wherein a side plate edge far away from the main plate wholly enters the slot when the clip is pressed by the lever.

4. The land grid array connector as claimed in claim 3, wherein a pair of clasping portions are defined in a middle of the main plate for pressing the land grid package.

5. The land grid array connector as claimed in claim 4, wherein a pair of hooks is defined at one end of the main plate for pivotably engaging with the stiffener.

6. The land grid array connector as claimed in claim 5, wherein an and-rotation bar is defined between the hooks.

7. A land grid array connector for interconnecting a land grid package and a circuit substrate, the land grid array connector comprising:
    a housing comprising a plurality of side surfaces;
    a stiffener defined around the housing, the stiffener comprising a bottom plate with an upper face thereon and a plurality of side walls extending upwardly from a periphety region of the bottom plate and cooperating with the bottom plate to form a space receiving the housing therein;
    a clip mounted upon one of said side walls of the stiffener in a moveable manner, the clip comprising a main plate and at least one side plate extending downwardly from one side of the main plate;
    a lever mounted on another portion of the stiffener for fastening the clip; wherein
    the side plate extends downwardly beyond the upper face; wherein
    the bottom late defines a slot adjacent to the corresponding one side wall.

8. The connector as claimed in claim 7, wherein said side plate is located inside of the corresponding one side wall.

9. A land grid array connector for interconnecting a land grid package and a circuit substrate, the land grid array connector comprising:
    a housing comprising a plurality of side surfaces;
    a stiffener defined around the housing, the stiffener comprising a bottom plate with an upper face thereon and a plurality of side walls extending upwardly from a periphery region of the bottom plate and cooperating with the bottom plate to form a space receiving said housing therein;

a clip mounted upon one of said side walls of the stiffener in a moveable manner, the clip comprising a main plate and at least one side plate extending downwardly from one side of the main plate;

a lever mounted on another portion of the stiffener for fastening the clip; wherein the side plate extends from the corresponding side with a distance which is larger than that between the main plate and the upper face; wherein a slot is formed in the bottom plate adjacent to the one corresponding side wall.

10. The connector as claimed in claim 9, wherein said side plate is located inside of one corresponding side wall.

11. The connector as claimed in claim 9, wherein said side plate extends downward in a straight manner.

12. The connector as claimed in claim 1, wherein said slot extends through the bottom wall vertically.

13. The connector as claimed in claim 7, wherein the slot extends through the bottom plate vertically.

14. The connector as claimed in claim 13, wherein a bottom edge of said side plate is received in the slot.

15. The connector as claimed in claim 9, wherein the slot extends through the bottom plate vertically.

16. The connector as claimed in claim 15, wherein a bottom edge of said side plate is received in the slot.

17. The connector as claimed in claim 7, wherein said slot further extends into the corresponding one side wall.

18. The connector as claimed in claim 9, wherein said slot further extends into the corresponding one side wall.

* * * * *